(12) United States Patent
Tang et al.

(10) Patent No.: US 7,253,364 B2
(45) Date of Patent: Aug. 7, 2007

(54) CIRCUIT BOARD HAVING ELECTRICALLY CONDUCTIVE STRUCTURE FORMED BETWEEN CIRCUIT LAYERS THEREOF AND METHOD FOR FABRICATING THE SAME

(75) Inventors: Sao-Hsia Tang, Hsin-chu (TW); Shing-Ru Wang, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 267 days.

(21) Appl. No.: 10/845,276

(22) Filed: May 12, 2004

(65) Prior Publication Data
US 2005/0029110 A1 Feb. 10, 2005

(30) Foreign Application Priority Data
Aug. 7, 2003 (TW) .............................. 92121625 A

(51) Int. Cl.
*H05K 1/11* (2006.01)
*H01R 12/04* (2006.01)
(52) U.S. Cl. ..................................... 174/262; 174/255
(58) Field of Classification Search ................ 174/262, 174/261, 255, 263, 264, 265, 266; 361/792, 361/793, 794, 795
See application file for complete search history.

(56) References Cited
U.S. PATENT DOCUMENTS 5,118,386 A * 6/1992 Kataoka et al. ............... 216/13
6,365,843 B1 * 4/2002 Shirai et al. ................. 174/262
6,376,052 B1 * 4/2002 Asai et al. ................... 428/209
6,717,069 B2 * 4/2004 Yoneda ....................... 174/262
6,828,510 B1 * 12/2004 Asai et al. ................... 174/255
2005/0121229 A1 * 6/2005 Takai et al. .................. 174/261

* cited by examiner

*Primary Examiner*—Ishwar (I. B.) Patel
(74) *Attorney, Agent, or Firm*—Fulbright & Jaworski L.L.P.

(57) ABSTRACT

A circuit board and a fabrication method thereof. Providing the insulating layer with a first conductive layer formed thereon; wherein the insulating layer was formed on a core substrate with at least one patterned circuit layer thereon. A first resist layer is applied on a first conductive layer, forming first openings to expose the first conductive layer. A first patterned circuit layer, including conductive pads and traces, is formed in the first openings. A second resist layer is applied to cover the traces, and a conductive post is formed on each conductive pad. The first and second resist layers and the first conductive layer underneath the first resist layer are removed. A dielectric material layer is formed on the insulating layer with first patterned circuit layer, forming second openings to expose the conductive posts. A second conductive layer is formed on the dielectric material layer and in the second openings. A third resist layer is applied on the second conductive layer, forming third openings of the third resist layer to expose the second conductive layer. A second patterned circuit layer is formed in the second and third openings.

2 Claims, 5 Drawing Sheets

CIRCUIT BOARD HAVING ELECTRICALLY CONDUCTIVE STRUCTURE FORMED BETWEEN CIRCUIT LAYERS THEREOF AND METHOD FOR FABRICATING THE SAME

FIELD OF THE INVENTION

The present invention relates to circuit boards having electrically conductive structures between circuit layers thereof and methods for fabricating the same, and more particularly, to a circuit board having an electrically conductive structure formed between neighboring circuit layers by filling vias in the circuit board through the use of electroplating technology, and a fabrication method of the circuit board.

BACKGROUND OF THE INVENTION

Due to gradually reduced size of electronic products, semiconductor packages used in the electronic products are accordingly required having high density, high speed and low cost, such as flip-chip package; ball grid array (BGA) package, chip size package (CSP) and multi chip module (MCM) that become the mainstream packaging technology in the market.

For flip-chip package, BGA package, CSP and MCM, the build-up technology for fabricating circuit boards is popularized and cost-effective to implement, making the build-up circuit boards commonly employed in these high-density packages. The build-up circuit boards are suitably used in for example microprocessor modules, 3D graphics acceleration cards, single-chip BGA packages, expansion cards and MCM packages.

The build-up technology generally involves laminating a plurality of interlaced insulating and circuit layers on the surface of the circuit board, and then forming conductive vias in the insulating layers to electrically interconnect the conductive layers. The conductive vias are fabricated using the "plating filled copper" technology that allows via holes in the insulating layers to be filled with copper by plating, making the fabricated circuit board toward high-end development.

FIGS. 2A to 2E show the conventional plating-filled-copper process. Referring first to FIG. 2A, a circuit board 20 is prepared with an inner circuit layer 20a formed thereon.

Referring to FIG. 2B, a resin coated copper (RCC) layer 22 is pressed on the circuit board 20 and covers the inner circuit layer 20a. Alternatively, the RCC layer 22 can be made by forming an insulating layer on the circuit board 20 and then depositing an electroless-plated copper layer on the insulating layer.

Referring to FIG. 2C, a via hole 23 is fabricated through the RCC layer 22 by dry etching or wet etching to expose the inner circuit layer 20a.

Referring to FIG. 2D, a conductive layer 24 is formed on the RCC layer 22, the inner wall of the via hole 23 and the exposed inner circuit layer 20a.

Referring to FIG. 2E, finally, a resist layer 25 is pressed onto the conductive layer 24 and patterned to expose the via hole 23, so as to electroplate copper into the via hole 23 to form a conductive via 26.

As the depth of the via hole and the thickness of the insulating layer formed using the plated filled copper technique known in the prior art are significantly large as shown in FIG. 2E, the via hole 23 cannot be effectively filled up by an electroplating process. Therefore, the plated filled copper technique known in the prior art is unreliable and leads to no conduction or ineffective conduction of the build-up circuit board. The production yield of the build-up circuit board is dramatically reduced as the precision of the fabrication cannot be absolutely achieved.

However, since the insulating layer is relatively thick and the via hole is relatively deep, the above conventional plating-filled-copper process usually fails to completely fill the via hole with electroplated copper, such that the fabricated conductive via is not reliable and the electrical connection between the circuit layers in the circuit board through the conductive via may be defective, thereby degrading the production yield of the circuit board.

Moreover, since the above via hole is small and has a high aspect ratio, a superfilling copper-plating solution should be used as a filling agent to successfully fill the via hole with copper. On the other hand, a normal copper-plating solution (such as copper sulfate, sulfuric acid and hydrochloric acid) is not suitable for the above plating-filled-copper process. The superfilling copper-plating solution usually contains certain additives and thus is expensive in preparation, which thereby undesirably increases the fabrication cost.

Therefore, the problem to be solved here is to provide an improved circuit board structure and its fabrication method, which can avoid the above prior-art drawbacks so as to reduce the fabrication cost and assure the production yield.

SUMMARY OF THE INVENTION

In light of the drawbacks of the prior art, a primary objective of the present invention is to provide a circuit board having an electrically conductive structure formed between circuit layers thereof and a method for fabricating the same, so as to allow neighboring circuit layers of the circuit board to be effectively electrically interconnected.

Another objective of the present invention is to provide a circuit board having an electrically conductive structure formed between circuit layers thereof and a method for fabricating the same, by which the electrically conductive structure is effectively deposited by electroplating to provide perfect electrical conduction between neighboring circuit layers of the circuit board.

In accordance with the above and other objectives, the present invention proposes a method for fabricating a circuit board having an electrically conductive structure formed between circuit layers thereof, comprising the steps of: providing an insulating layer, with a first conductive layer formed on a surface of the insulating layer; applying a first resist layer on the first conductive layer, and forming at least one first opening in the first resist layer to expose a predetermined part of the first conductive layer; performing an electroplating process to form a first patterned circuit layer in the first opening and on the exposed part of the first conductive layer, wherein the first patterned circuit layer comprises a plurality of conductive pads and traces; applying a second resist layer covering the traces of the first patterned circuit layer, and performing an electroplating process to form a conductive post on at least one of the conductive pads; removing the second resist layer, the first resist layer, and the first conductive layer underneath the first resist layer; forming a dielectric material layer on the insulating layer having the first patterned circuit layer, and forming at least one second opening in the dielectric material layer to expose the conductive post; forming a second conductive layer on the dielectric material layer and in the second opening, applying a third resist layer on the second conductive layer, and forming at least one third opening in the third resist layer to expose a predetermined part of the second conductive layer; and performing an electroplating process to form a second patterned circuit layer in the second opening and the third opening.

The circuit board fabricated by the above method comprises: an insulating layer; a first patterned circuit layer formed on the insulating layer; at least one dielectric material layer formed on the first patterned circuit layer; at least one conductive post formed in the dielectric material layer and electrically connected to the first patterned circuit layer; and a second patterned circuit layer formed on the dielectric material layer and having an extension portion electrically connected to the conductive post.

The circuit board having the electrically conductive structure formed between neighboring circuit layers thereof, proposed in the present invention, is fabricated by several distinct electroplating processes. First, the first patterned circuit layer is formed on an insulating layer of the circuit board by electroplating. Then, the conductive post is formed on the conductive pad of the first patterned circuit layer by electroplating to allow the thickness of the extension portion subsequently formed on the conductive post to be reduced. The second patterned circuit layer having the extension portion is formed on the conductive post by electroplating with the extension portion electrically connected to the conductive post. Thereby the via hole between neighboring circuit layers of the circuit board is filled up by several distinct electroplating processes, making the via hole completely filled with the filling material that is compactly deposited in the via hole, and also assuring the electrical connection between the circuit layers of the circuit board. Moreover, the height of the conductive post in the present invention can be adjusted to miniaturize the thickness of the extension portion, for the electrical connection use, subsequently formed on the conductive post, thereby improving the quality of electrical connection between neighboring circuit layers of the circuit board, and also simplifying the fabrication processes and reducing the fabrication cost as not requiring specific equipment or filling agent. As a result, the drawbacks of the prior art can be eliminated, and the production yield and reliability of the circuit board in the present invention are improved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiment of a method for fabricating a circuit board having an electrically conductive structure formed between circuit layers thereof proposed in the present invention is described in detail with reference to FIGS. 1A to 1J.

Figure 1A:
FIGS. 1A to 1J are cross-sectional diagrams showing the procedural steps of a method for fabricating a circuit board having an electrically conductive structure formed between circuit layers thereof according to the present invention.

Referring first to FIG. 1A, a dielectric insulating layer 10 is prepared with a first conductive layer 11 formed thereon. The dielectric insulating layer 10 can be made of a material such as epoxy resin, polyimide resin, cyanate ester, glass fiber, bismaleimide triazine (BT) resin, or a mixture (FR5) of epoxy resin and glass fiber. The dielectric material layer can be formed on the core substrate that has at least one patterned circuit layer thereon. The first conductive layer 11 primarily serves as a current conductive path for a subsequent electroplating process. The first conductive layer 11 can be made of a metal, an alloy, or several laminated metal layers, selected from Copper (Cu), Tin (Sn), Nickel (Ni), Chromium (Cr), Titanium (Ti) or Cu/Cr alloy. The conductive layer may be formed by the physical vapor deposition (PVD), chemical vapor deposition (CVD), electroless plating or chemical deposition technique, such as sputtering, evaporation, arc vapor deposition, ion bean sputtering, laser ablation deposition, or plasma enhanced chemical vapor deposition (PECVD). Preferably, the conductive layer is made of the electroless-plated copper particles. The dielectric insulating layer can be an insulating layer of a single-layer or multi-layer substrate.

Figure 1B:
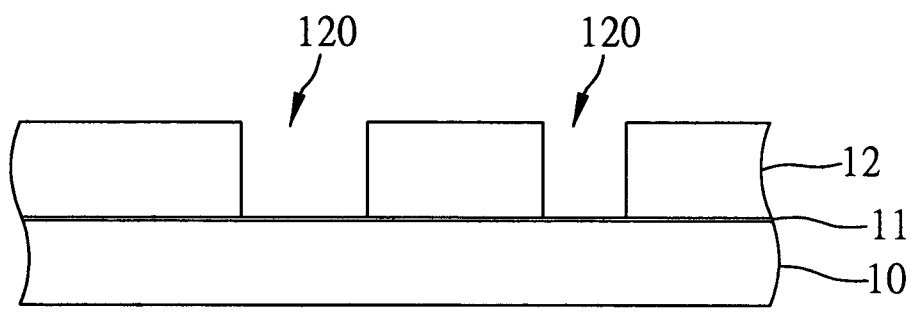

Referring to FIG. 1B, a first resist layer 12, such as a dry-film photoresist layer or liquid photoresist layer, is applied on the first conductive layer 11 by printing, coating, spin-coating or attaching. Then, the first resist layer 12 is patterned by exposure and development to form a plurality of first openings 120 to expose a predetermined part of the first conductive layer 11 via the first openings 120.

Figure 1C:
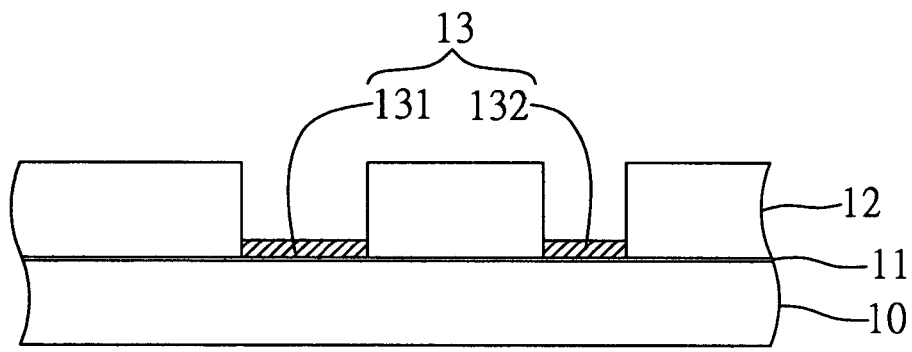

Referring to FIG. 1C, a first patterned circuit layer 13 is formed by electroplating in the first openings 120 of the first resist layer 12 and on the exposed part of the first conductive layer 11. The patterned circuit layer 13 primarily made of copper comprises a plurality of conductive pads 131 and traces 132 (only one of each is shown).

Figure 1D:
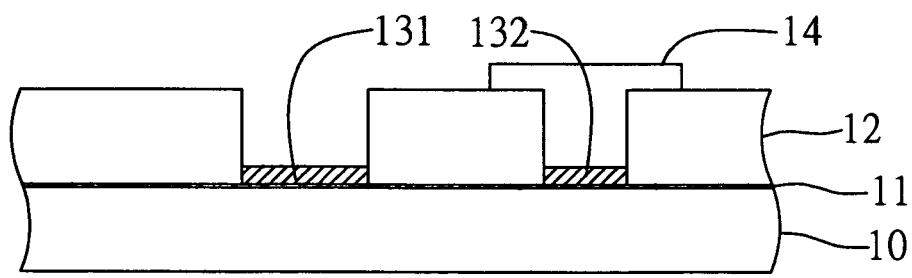

Referring to FIG. 1D, a second resist layer 14 is applied to cover the traces 132 of the first patterned circuit layer 13, wherein the material and fabrication method of the second resist layer 14 can be the same as those of the first resist layer 12.

Figure 1E:
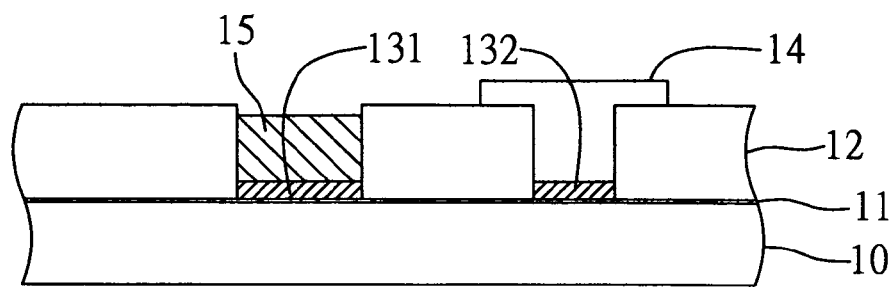

Referring to FIG. 1E, a conductive post 15 such as copper post is formed on the conductive pads 131 respectively by electroplating. The exposed surface of the conductive post 15 can be roughened to allow effective deposition of a subsequent electroplated metal layer (not shown) on the conductive post 15.

Figure 1F:
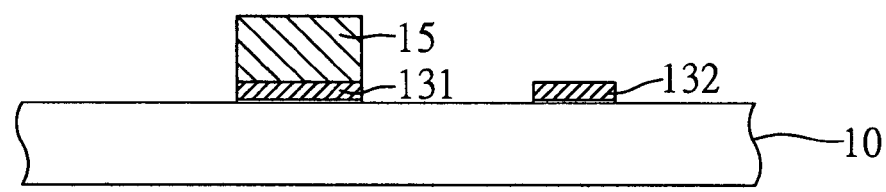

Referring to FIG. 1F, the second resist layer 14, the first resist layer 12 and the first conductive layer 11 underneath the first resist layer 12 are removed.

Figure 1G:
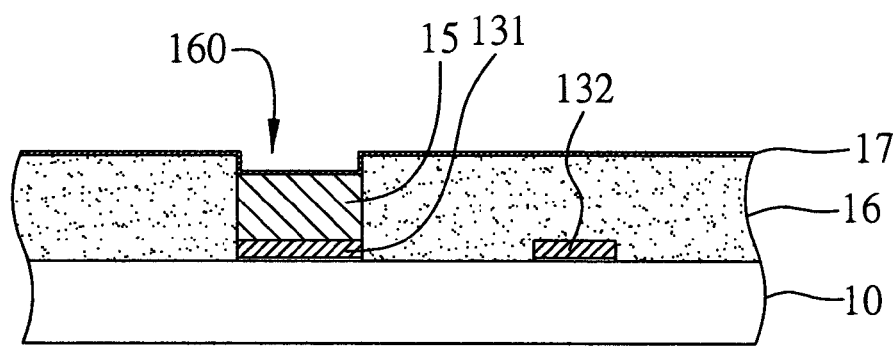
Figure 1G:
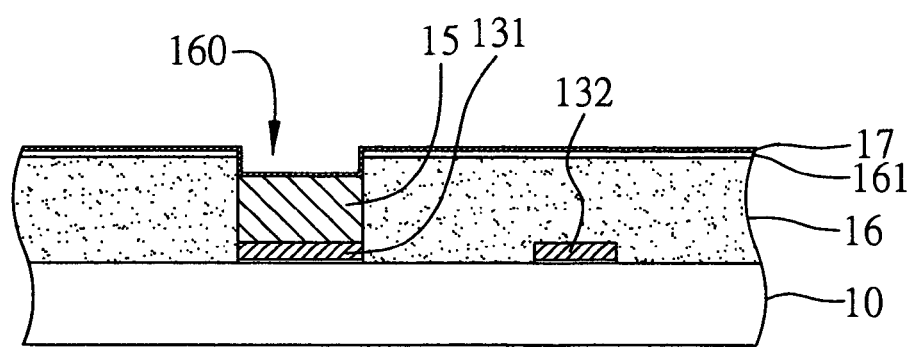

Referring to FIG. 1G, a dielectric material layer 16 is pressed on the insulating layer 10 having the first patterned circuit layer 13 thereon, wherein second openings 160 (only one is shown) are formed, for example by laser drilling, through the dielectric material layer 16 to expose the conductive posts 15 respective on the conductive pads 131. Then, a second conductive layer 17 is formed on the surface of the dielectric material layer 16 and the conductive posts 15, and used for fabrication of subsequent build-up circuit layers. Referring to FIG. 1G', the dielectric material layer 16 in FIG. 1G can be replaced by a dielectric material layer 16 pre-formed with a metal film 161. The dielectric material layer 16 with the metal film 161 can be directly pressed onto the insulating layer 10 having the first patterned circuit layer 13 thereon, which is fabricated by depositing a copper film on a phenolic polyester or epoxy resin layer, or by using a RCC (resin coated copper) layer. Alternatively, a dielectric material layer can be first pressed onto the insulating layer 10 having the circuit layer thereon, and then a copper foil is pressed on the dielectric material layer. The laser drilling technique can be adopted to form the second opening 160 through dielectric material layer 16 and the metal film 161. Then, the second conductive layer 17 can be formed by PVD or CVD on the surface of the metal film 161 and the conductive posts 15, so as to improve bondability and growth of subsequent electroplated copper and facilitate the performance of a subsequent patterning process for fabricating build-up circuit layers. The subsequent fabrication steps in this embodiment are illustrated using FIG. 1G.

The height of the conductive post 15 can be adjusted according to the thickness of the dielectric material layer 16 (the thickness of the conductive layer 17 is very small and can be ignored). The height of the conductive post 15 is slightly smaller than the thickness of the dielectric material layer 16, thereby making the distance between the bottom of the second opening 160 and the surface of the dielectric material layer 16 appropriately minimized. As a result, the depth of the second opening 160 for the subsequent electrical interconnection between circuit layers of the circuit board proposed in the present invention is dramatically much smaller than that of the prior art, such that subsequent electroplated material can be completely filled in the second opening 160 and the reliability of electrical connection in the circuit board can be assured thereby eliminating the drawbacks of the prior art.

Figure 1H:
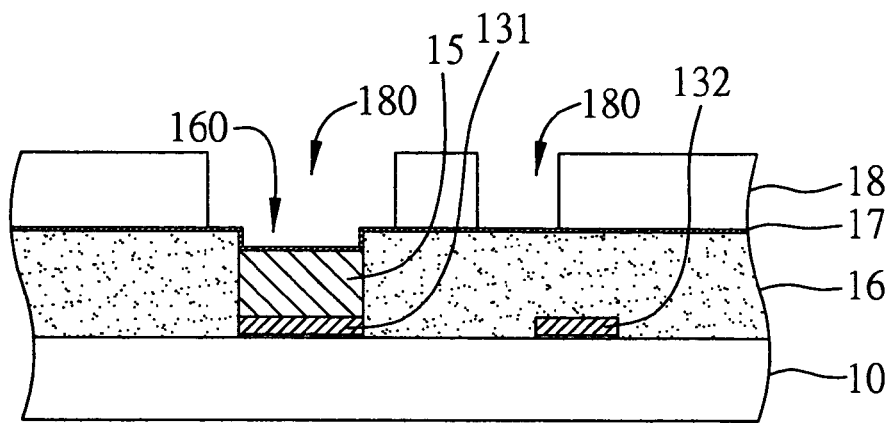

Referring to FIG. 1H, a third resist layer 18 is applied on the second conductive layer 17, and can be patterned by exposure and development to form a plurality of third openings 180 to expose part of the surface of the second conductive layer 17, wherein at least one third opening 180 corresponds in position to the second opening 160 where the conductive post 15 is located. The third resist layer 18, used to define a predetermined area for patterned circuits, can be made of dry-film or liquid photoresist.

Figure 1I:
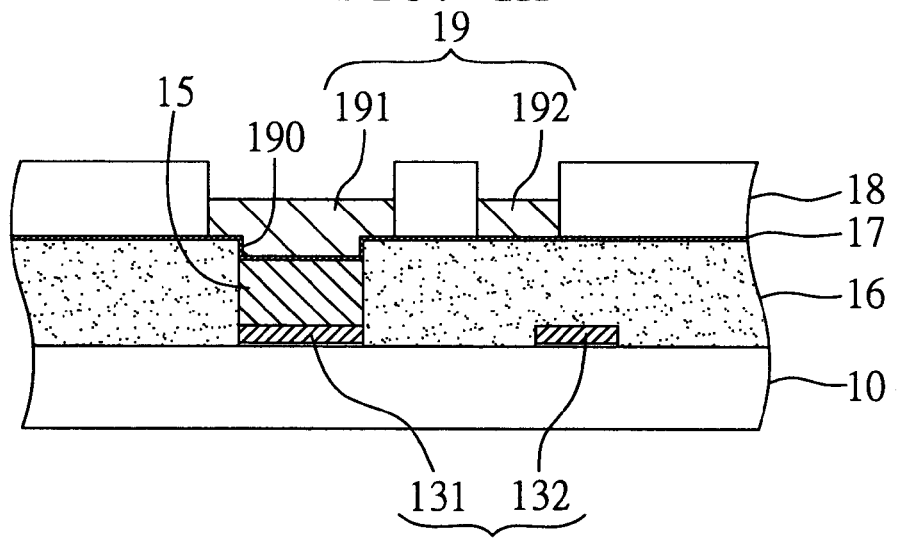

Referring to FIG. 1I, a metal layer (such as copper) is deposited in the second openings 160 and the third openings 180 by electroplating through the second conductive layer 17 serving as a current conductive path. A second patterned circuit layer 19 is formed in the third openings 180 and comprises a plurality of conductive pads 191 and traces 192. The electroplated metal layer in the second opening 160 serves as an extension portion 190 to electrically connect at least one conductive pad 191 of the second patterned circuit layer 19 to the conductive post 15, and the conductive post 15 is electrically connected to the first circuit layer 13, such that an electrically conductive structure between neighboring circuit layers of the circuit board 100 is fabricated. Since the electroplating process (for electrically deposited copper) can achieve a patterned circuit with low cost, high yield and high quality, and also perfect filling of via holes, the patterned circuit layer is preferably formed by electroplating in this embodiment.

Figure 1J:
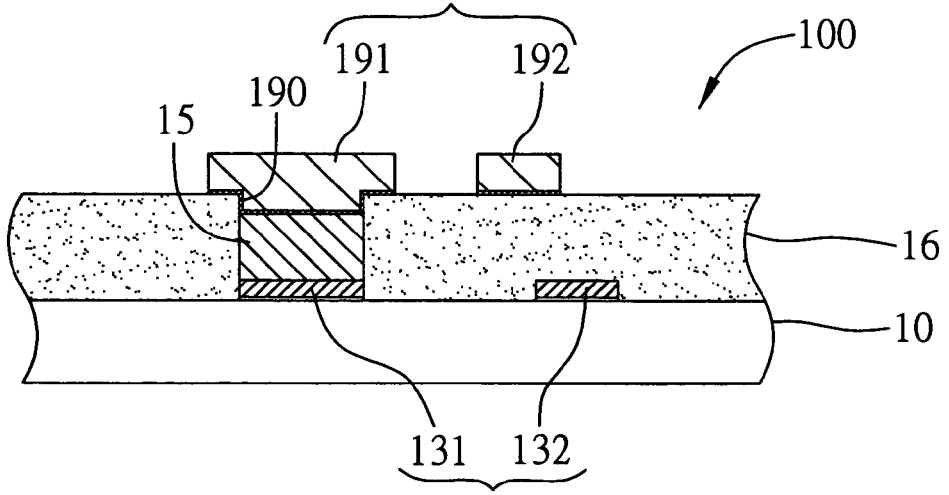
Figure 2A:
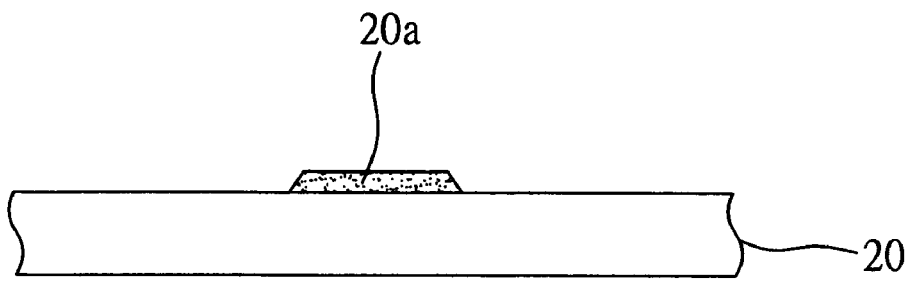
FIGS. 2A to 2E (PRIOR ART) are cross-sectional diagrams showing the procedural steps of a conventional plating-filled-copper process for a circuit board.
Figure 2B:
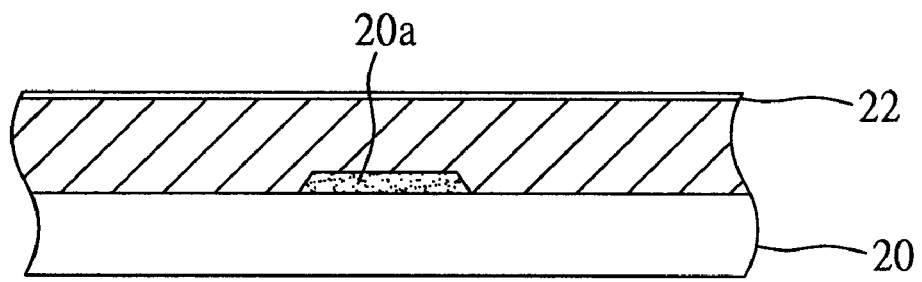
Figure 2C:
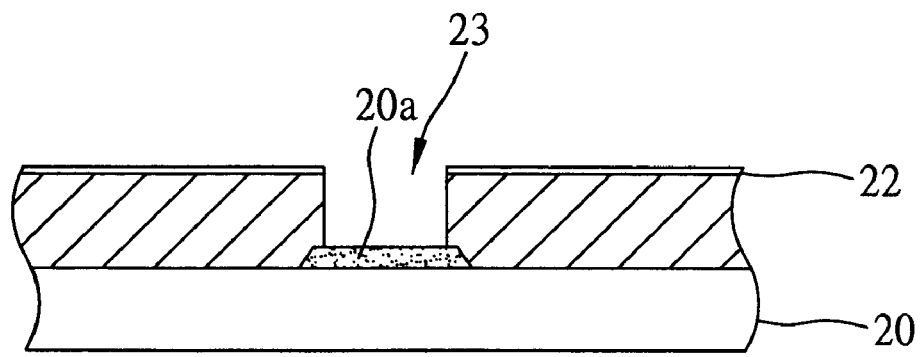
Figure 2D:
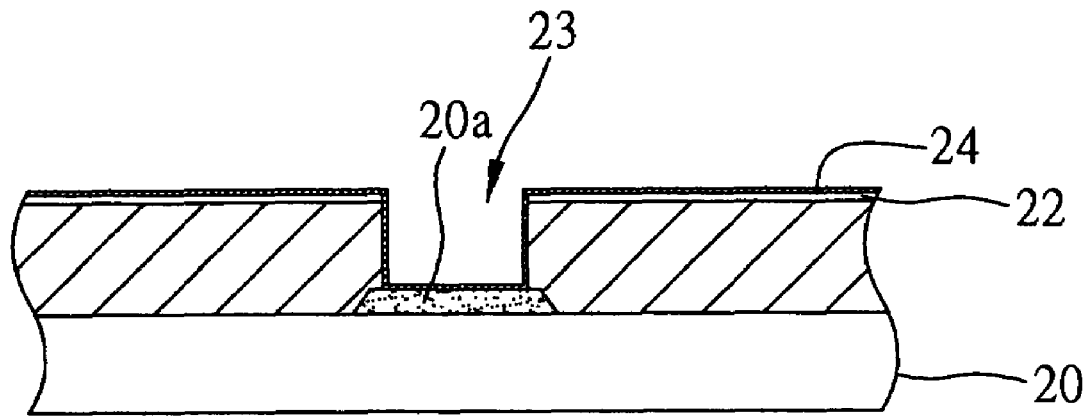
Figure 2E:
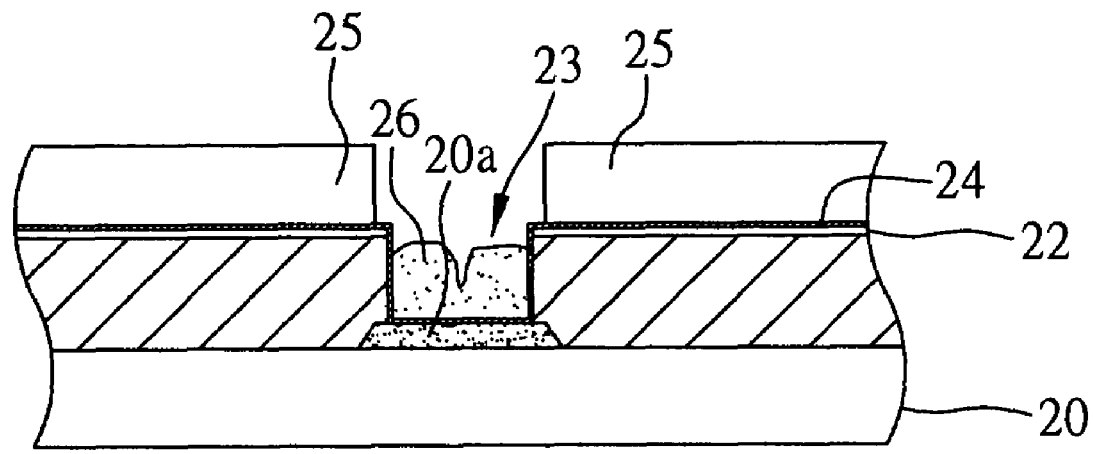

Referring to FIG. 1J, the third resist layer 18 and the second conductive layer 17 underneath the third resist layer 18 are removed. Alternatively, in the case of the dielectric material layer 16 with the metal film 161 (FIG. 1G'), such as RCC layer, being pressed on the insulating layer 10 having the first patterned circuit layer 13, it needs to remove the third resist layer 18, the second conductive layer 17 underneath the third resist layer 18, and the metal film 161 underneath the third resist layer 18.

In the present invention, the second resist layer is formed on the first patterned circuit layer to cover the traces not for forming conductive posts. Then the electroplating process is performed, using the first conductive layer as the current conductive path, to deposit conductive posts on the conductive pads not covered by the second resist layer, the conductive posts forming part of the electrically conductive structure subsequently fabricated by electroplating. Afterwards, a dielectric material layer is formed on the board with the first patterned circuit layer, and at least one opening is formed in the dielectric material layer and corresponds in position to the conductive post. A second conductive layer is formed on the dielectric material layer and serves as the current conductive path for subsequently electroplating an extension portion on the conductive post in the opening of the dielectric material layer. This completes the fabrication of the electrically conductive structure in the circuit board, such that a second pattern circuit layer subsequently formed on the extension portion can be electrically connected to the first pattern circuit layer through the electrically conductive structure. The present invention eliminates the drawbacks of the prior art that forms deep via holes and thus makes it difficult to completely fill the via holes thereby degrading the reliability of via filling and electrical connection between circuit layers, and that requires a special filling agent to fill the deep via holes thereby increasing the fabrication cost.

Referring to FIG. 1J, the circuit board 100 having an electrically conductive structure formed between neighboring circuit layers thereof, fabricated by the above method, comprises: an insulating layer 10 having at least one dielectric material layer 16 thereon; a first patterned circuit layer 13 formed on the insulating layer 10 and covered by the dielectric material layer 16; at least one conductive post 15 formed in the dielectric material layer 16 and electrically connected to the first patterned circuit layer 13; and a second patterned circuit layer 19 formed on the dielectric material layer 16 and having an extension portion 190 electrically connected to the conductive post 15.

The conductive post 15 can be made of copper. The dielectric material layer 16 is formed on a surface of the circuit board with inner circuits. The height of the conductive post 15 can be adjusted according to the thickness of the dielectric material layer 16. When the height of the conductive post 15 approaches the thickness of the dielectric material layer 16, the thickness of an extension portion subsequently formed on the conductive post 15 can be reduced. Thus, the depth of the electrically conductive structure between neighboring circuit layers of the circuit board is easily controlled.

The circuit board having the electrically conductive structure formed between neighboring circuit layers thereof, proposed in the present invention, is fabricated by several distinct electroplating processes. First, the first patterned circuit layer is formed on an insulating layer of the circuit board by electroplating. Then, the conductive post is formed on the conductive pad of the first patterned circuit layer by electroplating to allow the thickness of the extension portion subsequently formed on the conductive post to be reduced. The second patterned circuit layer having the extension portion is formed on the conductive post by electroplating with the extension portion electrically connected to the conductive post. Thereby the via hole between neighboring circuit layers of the circuit board is filled up by several distinct electroplating processes, making the via hole completely filled with the filling material that is compactly deposited in the via hole, and also assuring the electrical connection between the circuit layers of the circuit board.

In conclusion, the height of the conductive post in the present invention can be adjusted to miniaturize the thickness of the extension portion, for the electrical connection use, subsequently formed on the conductive post, thereby improving the quality of electrical connection between neighboring circuit layers of the circuit board, and also simplifying the fabrication processes and reducing the fabrication cost as not requiring specific equipment or filling agent. As a result, the drawbacks of the prior art can be eliminated, and the production yield and reliability of the circuit board in the present invention are improved.

It should be understood that the foregoing drawings of the present invention only show part of patterned circuits. The number of the conductive pads and traces of the patterned circuits is not limited to that shown in the drawings but should be arranged depending on the practical requirement. Further, the above fabrication method according to the present invention can be implemented on a single side or double sides of the circuit board. The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit board having an electrically conductive structure formed between circuit layers thereof, comprising:
   an insulating layer;
   a first patterned circuit layer formed on the insulating layer, the first patterned circuit layer having a plurality of conductive pads and traces;
   at least one dielectric material layer formed on the insulating layer, wherein second openings are penetratingly formed in the dielectric material layer to expose the conductive pads respectively;
   at least one conductive post formed in the second openings of dielectric material layer and electrically connected to the conductive pads of first patterned circuit layer, the conductive post and the conductive pads having the same diameter, and the conductive pads being formed in the dielectric material layer;
   a second conductive layer formed on the conductive post and part of the dielectric material layer; and
   a second patterned circuit layer formed on the second conductive layer and having an extension portion, wherein the extension portion fills the second openings and electrically connects with the conductive post.

2. The circuit board of claim 1, wherein the electrically conductive structure comprises the conductive post and the extension portion for electrically interconnecting the first patterned circuit layer and the second patterned circuit layer.

* * * * *